United States Patent
Matsuno et al.

(10) Patent No.: US 9,762,218 B2
(45) Date of Patent: Sep. 12, 2017

(54) AMPLIFYING CIRCUIT, AD CONVERTER, INTEGRATED CIRCUIT, AND WIRELESS COMMUNICATION APPARATUS

(71) Applicant: KABUSHIKI KAISHA TOSHIBA, Minato-ku (JP)

(72) Inventors: Junya Matsuno, Kawasaki (JP); Masanori Furuta, Odaware (JP); Tetsuro Itakura, Nerima (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/092,977

(22) Filed: Apr. 7, 2016

(65) Prior Publication Data

US 2016/0336930 A1    Nov. 17, 2016

(30) Foreign Application Priority Data

May 12, 2015  (JP) .................. 2015-097191

(51) Int. Cl.
*H03K 5/02* (2006.01)
*H03F 3/45* (2006.01)
*G11C 27/02* (2006.01)

(52) U.S. Cl.
CPC .............. *H03K 5/02* (2013.01); *G11C 27/026* (2013.01); *H03F 3/45183* (2013.01);
(Continued)

(58) Field of Classification Search
CPC ......... G11C 27/026; H03F 2203/45138; H03F 2203/45551; H03F 2203/45634; H03F 3/45183; H03F 3/45475; H03K 5/02
See application file for complete search history.

(56) References Cited

U.S. PATENT DOCUMENTS 3,665,172 A * 5/1972 Spaargaren .............. G05B 9/03
                                                                318/564
5,990,737 A * 11/1999 Czarnul .............. H03F 3/45183
                                                                330/295

(Continued)

OTHER PUBLICATIONS

Paul C. Yu et al. "A High-Swing 2-V CMOS Operational Amplifier with Replica-Amp Gain Enhancement", IEEE Journal of Solid-State Circuits, vol. 28, No. 12, Dec. 1993, 8 Pages.

*Primary Examiner* — Lewis West
(74) *Attorney, Agent, or Firm* — Oblon, McClelland, Maier & Neustadt, L.L.P.

(57) ABSTRACT

An amplifying circuit according to an embodiment includes an input terminal, an output terminal, first and second operational amplifiers, first and second input impedance elements, first to third feedback impedance elements, and an adder. The first (second) operational amplifier includes an inversion input terminal connected to a first (third) node and an output terminal connected to a second (fourth) node. The first (second) input impedance element has one end connected to the input terminal and the other end connected to the first (third) node. The first (second) feedback impedance element has one end connected to the first (third) node and the other end connected to the second (fourth) node. The third feedback impedance element has one end connected to the first node and the other end connected to the fourth node. The adder adds output voltages of the first and second operational amplifiers.

13 Claims, 9 Drawing Sheets

(52) U.S. Cl.
CPC ............. *H03F 3/45475* (2013.01); *H03F 2203/45138* (2013.01); *H03F 2203/45551* (2013.01); *H03F 2203/45634* (2013.01)

(56) References Cited

U.S. PATENT DOCUMENTS

| | | | | |
|---|---|---|---|---|
| 6,359,505 | B1* | 3/2002 | Joffe | H03F 1/565 330/103 |
| 6,359,510 | B1* | 3/2002 | Ishii | H03F 3/45183 330/253 |
| 6,549,971 | B1* | 4/2003 | Cecchi | H04L 25/0292 327/55 |
| 6,731,165 | B1* | 5/2004 | Marz | H03F 1/26 330/149 |
| 6,781,464 | B2* | 8/2004 | Ueno | H03F 3/211 330/258 |
| 6,977,547 | B2* | 12/2005 | Udupa | H03F 3/45977 330/254 |
| 9,269,830 | B2* | 2/2016 | Matsunaga | H01L 29/0696 |
| 9,319,004 | B2* | 4/2016 | Bandyopadhyay | H03F 3/45475 |
| 2007/0252645 | A1* | 11/2007 | Tsurumi | H03F 1/342 330/124 R |
| 2012/0229205 | A1* | 9/2012 | Koyama | H03F 3/3022 330/69 |

* cited by examiner

US 9,762,218 B2

AMPLIFYING CIRCUIT, AD CONVERTER, INTEGRATED CIRCUIT, AND WIRELESS COMMUNICATION APPARATUS

CROSS REFERENCE TO RELATED APPLICATION(S)

This application is based upon and claims the benefit of priority from the prior Japanese Patent Application No. 2015-097191, filed on May 12, 2015, the entire contents of which are incorporated herein by reference.

FIELD

Embodiments described herein relate generally to an amplifying circuit, an AD converter, an integrated circuit, and a wireless communication apparatus.

BACKGROUND

In the related art, an amplifying circuit including a main operational amplifier and a subsidiary operational amplifier is suggested to reduce an amplification error occurring due to finite gain of an operational amplifier. In the amplifying circuit, a virtual ground voltage of the subsidiary operational amplifier is amplified and is added to an output voltage of the main operational amplifier. As a result, gain of the main operational amplifier can be improved in an equivalent manner, the amplification error can be reduced, and amplification precision of the amplifying circuit can be improved.

However, in the amplifying circuit according to the related art, the amplification error occurs due to mismatching between the main operational amplifier and the subsidiary operational amplifier caused by a manufacturing variation of a semiconductor. In the amplifying circuit according to the related art, improvement of the amplification precision is limited by the amplification error.

DETAILED DESCRIPTION

Embodiments will now be explained with reference to the accompanying drawings. The present invention is not limited to the embodiments.

An amplifying circuit according to an embodiment includes an input terminal, an output terminal, a first operational amplifier, a first input impedance element, a first feedback impedance element, a second operational amplifier, a second input impedance element, a second feedback impedance element, a third feedback impedance element, and an adder. The input terminal receives an input voltage. The output terminal outputs an output voltage. The first operational amplifier includes an inversion input terminal connected to a first node, a non-inversion input terminal, and an output terminal connected to a second node. One end of the first input impedance element is connected to the input terminal and the other end thereof is connected to the first node. One end of the first feedback impedance element is connected to the first node and the other end thereof is connected to the second node. The second operational amplifier includes an inversion input terminal connected to a third node, a non-inversion input terminal, and an output terminal connected to a fourth node. One end of the second input impedance element is connected to the input terminal and the other end thereof is connected to the third node. One end of the second feedback impedance element is connected to the third node and the other end thereof is connected to the fourth node. One end of the third feedback impedance element is connected to the first node and the other end thereof is connected to the fourth node. The adder adds an output voltage of the first operational amplifier and an output voltage of the second operational amplifier and outputs an added output voltage.

Figure 1:
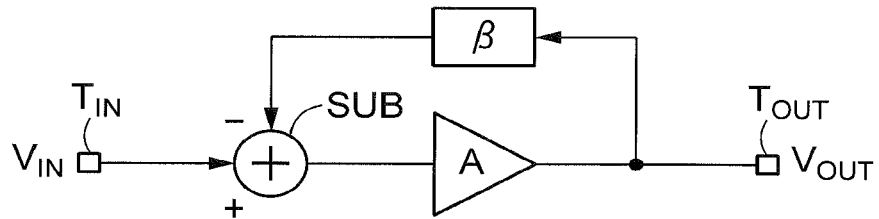
FIG. 1 is a functional block diagram illustrating an amplifying circuit according to the related art.

First, an amplifying circuit according to the related art will be described. FIG. 1 is a functional block diagram illustrating the amplifying circuit according to the related art. The amplifying circuit of FIG. 1 includes an input terminal $T_{IN}$, an output terminal $T_{OUT}$, an amplifier A, a feedback circuit β, and a subtracter SUB. The input terminal $T_{IN}$ receives an input voltage $V_{IN}$. The output terminal $T_{OUT}$ outputs an output voltage $V_{OUT}$. If gain of the amplifier A is set as A and a feedback coefficient of the feedback circuit β is set as β, the output voltage $V_{OUT}$ of the amplifying circuit is represented by the following formula.

[Formula 1]

$$V_{OUT} = \frac{1}{\beta}\left\{1 - \frac{1}{\beta A} + \left(\frac{1}{\beta A}\right)^2 - \ldots \right\}V_{IN} \quad (1)$$

In the formula 1, the output voltage $V_{OUT}$ is Taylor-expanded and is shown. Meanwhile, a first term $(1/\beta \times V_{IN})$ of a right side of the formula 1 is an expectation value (design value) of the output voltage $V_{OUT}$. Meanwhile, a portion $(1/\beta \times \{-1/\beta A+(1/\beta A)^2- \ldots \} \times V_{IN})$ after a second term of the right side of the formula 1 is an error voltage to an expectation value of the output voltage $V_{OUT}$. Hereinafter, an X-th term of the right side of the formula 1 is simply referred to as the X-th term.

From the formula 1, it is known that the error voltage is inversely proportional to the gain A of the amplifier A and becomes 0 when A is infinite. However, in actuality, the gain A has a finite value. In addition, it is difficult to manufacture the amplifier A having high gain, due to miniaturzation of a semiconductor process. For this reason, in the amplifying circuit of FIG. 1, the error voltage according to the gain A is generated.

For example, in the case of $\beta=\frac{1}{2}$ and $A=100$, the first term of the formula 1 becomes $1/\beta \times V_{IN} = 2 \times V_{IN}$, the second term becomes $-1/\beta^2 A^2 \times V_{IN} = -0.04 \times V_{IN}$, and the third term becomes $1/\beta^3 A^2 \times V_{IN} = 0.0008 \times V_{IN}$. Therefore, if a portion after a fourth term is ignored, $V_{OUT} = (2-0.04+0.0008)V_{IN} = 2.0408 V_{IN}$ is obtained. That is, in the output voltage $V_{OUT}$, an error voltage of 2.04% is generated with respect to the expectation value.

Figure 2:
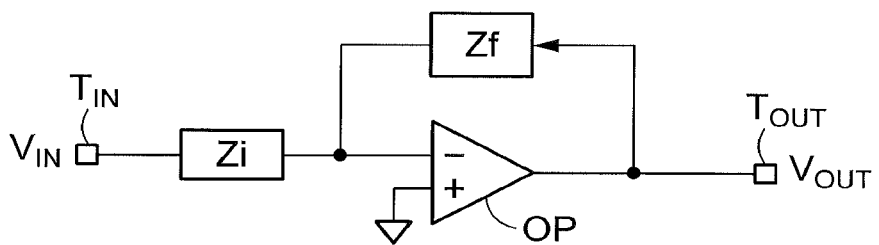
FIG. 2 is a circuit diagram illustrating an example of the amplifying circuit of FIG. 1.

FIG. 2 is a circuit diagram illustrating an example of the amplifying circuit of FIG. 1. An amplifying circuit of FIG. 2 includes an input terminal $T_{IN}$, an output terminal $T_{OUT}$, an operational amplifier OP, an input impedance element Zi, and a feedback impedance element Zf. The operational amplifier OP corresponds to the amplifier A of FIG. 1. If gain of the operational amplifier OP is set as A, impedance of the input impedance element Zi is set as Zi, and impedance of the feedback impedance element Zf is set as Zf, an output voltage $V_{OUT}$ of the amplifying circuit is represented by the following formula.

[Formula 2]

$$V_{OUT} = -\frac{Z_f}{Z_i}\left\{1 - \frac{Z_i + Z_f}{Z_i A} + \left(\frac{Z_i + Z_f}{Z_i A}\right)^2 - \ldots\right\} V_{IN} \quad (2)$$

Similar to the formula 1, a first term of the formula 2 is an expectation value of the output voltage $V_{OUT}$ and a portion after a second term of the formula 2 is an error voltage to the expectation value of the output voltage $V_{OUT}$. In addition, in the formula 2, a feedback coefficient $\beta$ is $Z_i/Z_f$. From the formulas 1 and 2, it is known that the error voltage of the amplifying circuit according to the related art is inversely proportional to the gain A and an error voltage of the second term is dominant.

Figure 3:
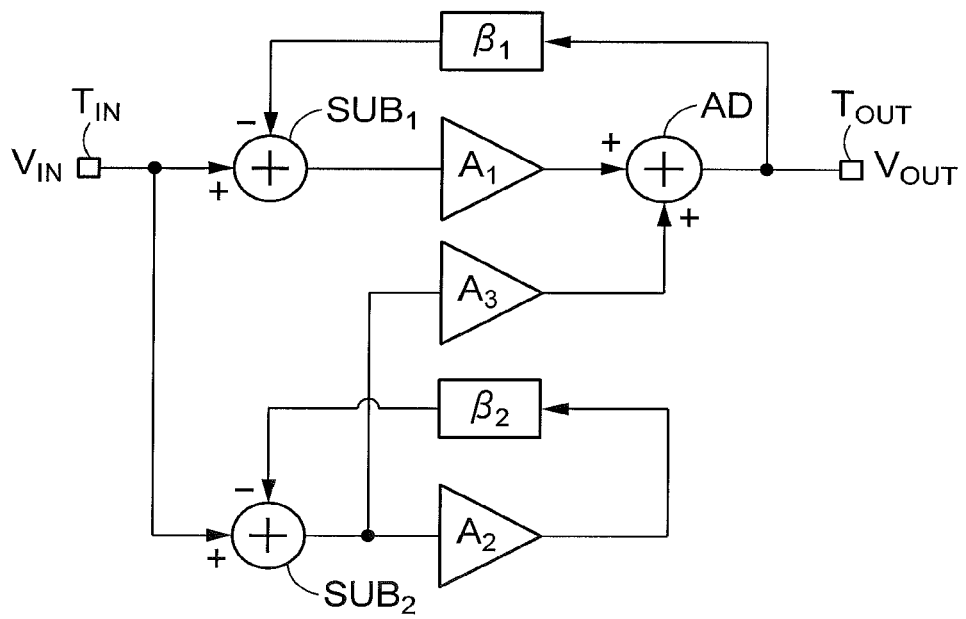
FIG. 3 is a functional block diagram illustrating an amplifying circuit according to the related art including a main operational amplifier and a subsidiary operational amplifier.

Therefore, in the related art, an amplifying circuit of FIG. 3 is suggested as an amplifying circuit to reduce the error voltage. FIG. 3 is a functional block diagram illustrating an amplifying circuit according to the related art including a main operational amplifier and a subsidiary operational amplifier. The amplifying circuit of FIG. 3 includes an input terminal $T_{IN}$, an output terminal $T_{OUT}$, amplifiers $A_1$ to $A_3$, feedback circuits $\beta_1$ and $\beta_2$, subtracters $SUB_1$ and $SUB_2$, and an adder AD. The amplifier $A_1$ is a main amplifier and the amplifiers $A_2$ and $A_3$ are subsidiary amplifiers. If gains of the amplifiers $A_1$ to $A_3$ are set as $A_1$ to $A_3$, feedback coefficients of the feedback circuits $\beta_1$ and $\beta_2$ are set as $\beta_1$ and $\beta_2$, and $\beta_1 = \beta_2 = \beta$ is set, an output voltage $V_{OUT}$ of the amplifying circuit is represented by the following formula.

[Formula 3]

$$V_{OUT} = \frac{1}{\beta}\left\{1 - \frac{1}{\beta A_1}\left(1 - \frac{A_3}{A_2}\right) - \frac{A_3}{\beta^2 A_1 A_2^2} + \ldots\right\} V_{IN} \quad (3)$$

In the formula 3, a first term is an expectation value of the output voltage $V_{OUT}$ and a portion after a second term is an error voltage to the expectation value of the output voltage $V_{OUT}$. As known from the formula 3, the error voltage is inversely proportional to the gain $A_1$. This is the same as the amplifying circuit of FIG. 1. Meanwhile, the amplifying circuit of FIG. 3 is different from the amplifying circuit of FIG. 1 in that an error voltage of the second term is removed in the case of $A_2 = A_3$.

As described above, in the amplifying circuit of FIG. 1, the error voltage of the second term is dominant in the error voltage of the output voltage $V_{OUT}$. For this reason, if the error voltage of the second term is removed, the entire error voltage can be reduced. For example, in the case of $\beta = \frac{1}{2}$ and $A_1 = A_2 = A_3 = 100$, the first term of the formula 3 becomes $1/\beta \times V_{IN} = 2 \times V_{IN}$, the second term becomes $-(1/\beta^2 A_1)(1-A_3/A_2) \times V_{IN} = 0$, and the third term becomes $-A_3/\beta^3 A_1 A_2^2 \times V_{IN} = -0.0008 \times V_{IN}$. Therefore, if a portion after a fourth term is ignored, $V_{OUT} = (2-0.0008)V_{IN} = 1.9992 V_{IN}$ is obtained. That is, an error voltage generated in the output voltage $V_{OUT}$ of the amplifying circuit of FIG. 3 is 0.04% with respect to an expectation value. As such, the amplifying circuit of FIG. 3 can greatly reduce the error voltage, as compared with the amplifying circuit of FIG. 1.

However, in actuality, mismatching occurs in the main amplifiers $A_2$ and $A_3$, due to a manufacturing variation or an environmental variation of the semiconductor. The mismatching means that a deviation occurs in gains of the two amplifiers. For example, when $A_2$ and $A_3$ deviate by 20% and $A_3/A_2 = 1.2$ is obtained, the second term of the formula 3 becomes $0.008 \times V_{IN}$ and $V_{OUT} = (2+0.008-0.0008)V_{IN} = 2.0082 V_{IN}$ is obtained. At this time, the error voltage becomes 0.41% and becomes larger than an error voltage in the case of $A_2 = A_3$ (the case in which the mismatching does not occur) by one digit.

As such, in the amplifying circuit according to the related art illustrated in FIG. 3, the error voltage generated in the output voltage $V_{OUT}$ increases due to the mismatching of the gains between the amplifiers.

First Embodiment

Figure 4:
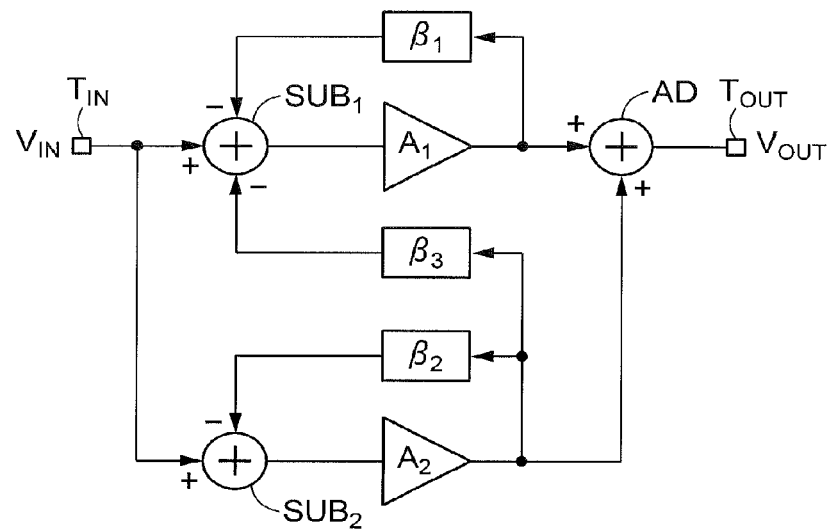
FIG. 4 is a functional block diagram illustrating an amplifying circuit according to a first embodiment.

Hereinafter, an amplifying circuit according to a first embodiment will be described with reference to FIG. 4. FIG. 4 is a functional block diagram illustrating the amplifying circuit according to this embodiment. As illustrated in FIG. 4, the amplifying circuit includes an input terminal $T_{IN}$, an output terminal $T_{OUT}$, amplifiers $A_1$ and $A_2$, feedback circuits $\beta_1$ to $\beta_3$, subtracters $SUB_1$ and $SUB_2$, and an adder AD. The input terminal $T_{IN}$ receives an input voltage $V_{IN}$. The output terminal $T_{OUT}$ outputs an output voltage $V_{OUT}$.

The amplifier $A_1$ is a main amplifier of the amplifying circuit according to this embodiment. The amplifier $A_1$ receives an output voltage of the subtracter $SUB_1$. The amplifier $A_1$ amplifies the received voltage with predetermined gain and outputs the voltage. It is assumed that gain of the amplifier $A_1$ is $A_1$. The output voltage of the amplifier $A_1$ is input to the adder AD and the feedback circuit $\beta_1$. The amplifier $A_1$ is configured by an operational amplifier, for example.

The amplifier $A_2$ is a subsidiary amplifier of the amplifying circuit according to this embodiment. The amplifier $A_2$ receives an output voltage of the subtracter $SUB_2$. The amplifier $A_2$ amplifies the received voltage with predetermined gain and outputs the voltage. It is assumed that gain of the amplifier $A_2$ is $A_2$. The output voltage of the amplifier $A_2$ is input to the adder AD and the feedback circuits $\beta_2$ and $\beta_3$. The amplifier $A_2$ is configured by an operational amplifier, for example.

The feedback circuit $\beta_1$ receives the output voltage of the amplifier $A_1$. The feedback circuit $\beta_1$ feeds back a voltage according to the received voltage. It is assumed that a feedback coefficient of the feedback circuit $\beta_1$ is $\beta_1$. The voltage fed back by the feedback circuit $\beta_1$ is input to the subtracter $SUB_1$. The feedback circuit $\beta_1$ is configured by an impedance element such as a resistive element and a capacitative element, for example. The feedback circuit $\beta_2$ receives the output voltage of the amplifier $A_2$. The feedback circuit $\beta_2$ feeds back a voltage according to the received voltage. It is assumed that a feedback coefficient of the feedback circuit $\beta_2$ is $\beta_2$. The voltage fed back by the feedback circuit $\beta_2$ is input to the subtracter $SUB_2$. The feedback circuit $\beta_2$ is configured by an impedance element such as a resistive element and a capacitative element, for example.

The feedback circuit $\beta_3$ receives the output voltage of the amplifier $A_2$. The feedback circuit $\beta_3$ feeds back a voltage according to the received voltage. It is assumed that a feedback coefficient of the feedback circuit $\beta_3$ is $\beta_3$. The voltage fed back by the feedback circuit $\beta_3$ is input to the subtracter $SUB_1$. The feedback circuit $\beta_3$ is configured by an impedance element such as a resistive element and a capacitative element, for example.

The subtracter $SUB_1$ receives the input voltage $V_{IN}$ and the voltages fed back by the feedback circuits $\beta_1$ and $\beta_3$. The subtracter $SUB_1$ subtracts the voltages fed back by the feedback circuits $\beta_1$ and $\beta_3$ from the input voltage $V_{IN}$ and outputs the voltage. An output voltage of the subtracter $SUB_1$ is input to the amplifier $A_1$.

The subtracter $SUB_2$ receives the input voltage $V_{IN}$ and the voltage fed back by the feedback circuit $\beta_2$. The subtracter $SUB_2$ subtracts the voltage fed back by the feedback circuit $\beta_2$ from the input voltage $V_{IN}$ and outputs the voltage. An output voltage of the subtracter $SUB_2$ is input to the amplifier $A_2$.

The adder AD receives the output voltage of the amplifier $A_1$ and the output voltage of the amplifier $A_2$. The adder AD adds the output voltage of the amplifier $A_1$ and the output voltage of the amplifier $A_2$ and outputs the voltage. An output voltage of the adder AD becomes the output voltage $V_{OUT}$ of the amplifying circuit.

If $\beta_1=\beta_2=\beta_3=\beta$ is set, the output voltage $V_{OUT}$ of the amplifying circuit according to this embodiment is represented by the following formula.

[Formula 4]

$$V_{OUT} = \frac{1}{\beta}\left(1 - \frac{1}{\beta^2 A_1 A_2} + \ldots\right)V_{IN} \quad (4)$$

In the formula 4, a first term is an expectation value of the output voltage $V_{OUT}$ and a portion after a second term is an error voltage to the expectation value of the output voltage $V_{OUT}$. As known from the formula 4, an error voltage of the second term is inversely proportional to $A_1 \times A_2$.

For example, in the case of $\beta=\frac{1}{2}$ and $A_1=A_2=100$, the first term of the formula 4 becomes $1/\beta \times V_{IN}=2 \times V_{IN}$, the second term becomes $-1/\beta^3 A_1 A_2 \times V_{IN}=-0.0008 \times V_{IN}$. Therefore, if a portion after a third term is ignored, $V_{OUT}=(2-0.0008)V_{IN}=1.9992V_{IN}$ is obtained. That is, an error voltage generated in the output voltage $V_{OUT}$ of the amplifying circuit according to this embodiment becomes 0.04% with respect to the expectation value. As such, similar to the amplifying circuit of FIG. 3, the amplifying circuit according to this embodiment can greatly reduce the error voltage as compared with the amplifying circuit of FIG. 1, when mismatching does not occur between the amplifiers.

Meanwhile, different from the amplifying circuit of FIG. 3, in the amplifying circuit according to this embodiment, even when the mismatching occurs between the amplifiers $A_1$ and $A_2$, the error voltage can be suppressed.

For example, when $A_1$ and $A_2$ deviate by 20% and $A_1=80$ and $A_2=100$ are obtained, the second term becomes $0.001 \times V_{IN}$. Therefore, if a portion after a third term is ignored, $V_{OUT}=(2-0.001)V_{IN}=1.999V_{IN}$ is obtained. At this time, it is known that the error voltage is 0.05% and becomes smaller than the error voltage of the amplifying circuit of FIG. 3 by one digit. As such, in the amplifying circuit according to this embodiment, the error voltage when the mismatching occurs between the amplifiers can be greatly reduced as compared with the amplifying circuit of FIG. 3. This is because the second term of the formula 4 is inversely proportional to the square $(A_1 \times A_2)$ of the gain.

As described above, the amplifying circuit according to this embodiment can suppress a dominent error voltage (error voltage of the second term) in the error voltage generated in the output voltage $V_{OUT}$. Therefore, the input voltage $V_{IN}$ can be amplified with high precision.

In addition, even when the mismatching of the gains occurs between the amplifiers, due to the manufacturing variation or the environmental variation of the semiconductor, the amplifying circuit according to this embodiment can reduce the error voltage and amplify the input voltage $V_{IN}$ with high precision.

Second Embodiment

Figure 5:
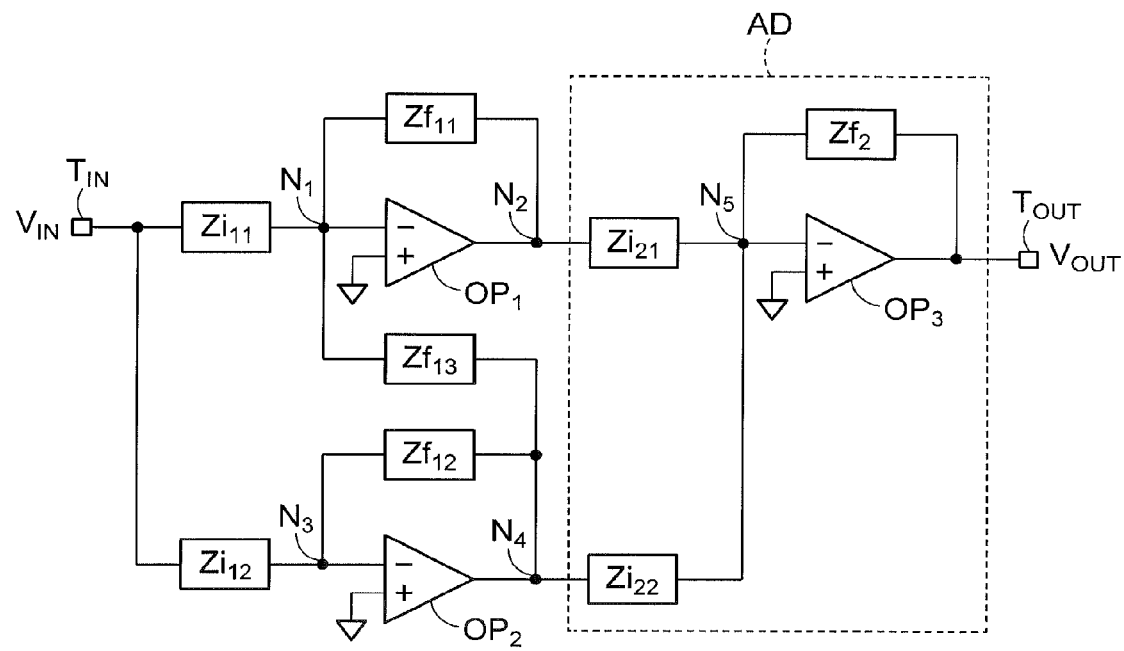
FIG. 5 is a circuit diagram illustrating an amplifying circuit according to a second embodiment.

A second embodiment will be described with reference to FIG. 5. In this embodiment, an example of the amplifying circuit according to the first embodiment will be described. FIG. 5 is a circuit diagram illustrating an example of the amplifying circuit of FIG. 4.

As illustrated in FIG. 5, the amplifying circuit according to this embodiment includes an input terminal $T_{IN}$, an output terminal $T_{OUT}$, operational amplifiers $OP_1$ to $OP_3$, input impedance elements $Zi_{11}$, $Zi_{12}$, $Zi_{21}$, and $Zi_{22}$, and feedback impedance elements $Zf_{11}$, $Zf_{12}$, $Zf_{13}$, and $Zf_2$.

The operational amplifier $OP_1$ (first operational amplifier) is a main operational amplifier. An inversion input terminal (-) of the operational amplifier $OP_1$ is connected to a node $N_1$ (first node), a non-inversion input terminal (+) thereof is connected to a ground line, and an output terminal thereof is connected to a node $N_2$ (second node). The node $N_1$ is a connection point of the inversion input terminal of the operational amplifier $OP_1$, the input impedance element $Zi_{11}$, and the feedback impedance elements $Zf_{11}$ and $Zf_{13}$. The node $N_2$ is a connection point of the output terminal of the operational amplifier $OP_1$, the input impedance element $Zi_{21}$, and the feedback impedance element $Zf_{11}$. Hereinafter, "connected to the ground line" is called "grounded". The operational amplifier $OP_1$ corresponds to the amplifier $A_1$ of FIG. 4. It is assumed that gain of the operational amplifier $OP_1$ is $A_1$.

The operational amplifier $OP_2$ (second operational amplifier) is a subsidiary operational amplifier. An inversion input terminal (-) of the operational amplifier $OP_2$ is connected to a node $N_3$ (third node), a non-inversion input terminal (+) thereof is grounded, and an output terminal thereof is connected to a node $N_4$ (fourth node). The node $N_3$ is a connection point of the inversion input terminal of the operational amplifier $OP_2$, the input impedance element $Zi_{12}$, and the feedback impedance element $Zf_{12}$. The node $N_4$ is a connection point of the output terminal of the operational amplifier $OP_2$, the input impedance element $Zi_{22}$, and the feedback impedance elements $Zf_{12}$ and $Zf_{13}$. The operational amplifier $OP_2$ corresponds to the amplifier $A_2$ of FIG. 4. It is assumed that gain of the operational amplifier $OP_2$ is $A_2$.

One end of the input impedance element $Zi_{11}$ (first input impedance element) is connected to the input terminal $T_{IN}$ and the other end thereof is connected to the node $N_1$. The input voltage $V_{IN}$ is applied to the inversion input terminal of the operational amplifier $OP_1$ through the input impedance element $Zi_{11}$. It is assumed that impedance of the input impedance element $Zi_{11}$ is $Zi_{11}$.

One end of the input impedance element $Zi_{12}$ (second input impedance element) is connected to the input terminal $T_{IN}$ and the other end thereof is connected to the node $N_3$. The input voltage $V_{IN}$ is applied to the inversion input terminal of the operational amplifier $OP_2$ through the input impedance element $Zi_{12}$. It is assumed that impedance of the input impedance element $Zi_{12}$ is $Zi_{12}$.

One end of the feedback impedance element $Zf_{11}$ (first feedback impedance element) is connected to the node $N_1$ and the other end thereof is connected to the node $N_2$. The output voltage of the operational amplifier $OP_1$ is fed back to the inversion input terminal of the operational amplifier $OP_1$ through the feedback impedance element $Zf_{11}$. It is assumed that impedance of the feedback impedance element $Zf_{11}$ is $Zf_{12}$.

One end of the feedback impedance element $Zf_{12}$ (second feedback impedance element) is connected to the node $N_3$ and the other end thereof is connected to the node $N_4$. The output voltage of the operational amplifier $OP_2$ is fed back to the inversion input terminal of the operational amplifier $OP_2$ through the feedback impedance element $Zf_{12}$. It is assumed that impedance of the feedback impedance element $Zf_{12}$ is $Zf_{12}$.

One end of the feedback impedance element $Zf_{13}$ (third feedback impedance element) is connected to the node $N_1$ and the other end thereof is connected to the node $N_4$. The output voltage of the operational amplifier $OP_2$ is fed back to the inversion input terminal of the operational amplifier $OP_1$ through the feedback impedance element $Zf_{13}$. It is assumed that impedance of the feedback impedance element $Zf_{13}$ is $Zf_{13}$.

An inversion input terminal (−) of the operational amplifier $OP_3$ (third operational amplifier) is connected to a node $N_5$ (fifth node), a non-inversion input terminal (+) thereof is grounded, and an output terminal thereof is connected to the output terminal $T_{OUT}$. The node $N_5$ is a connection point of the inversion input terminal of the operational amplifier $OP_3$, the input impedance elements $Zi_{21}$ and $Zi_{22}$, and the feedback impedance element $Zf_2$. It is assumed that gain of the operational amplifier $OP_3$ is $A_3$.

One end of the feedback impedance element $Zf_2$ (fourth feedback impedance element) is connected to the node $N_5$ and the other end thereof is connected to the output terminal $T_{OUT}$. The output voltage of the operational amplifier $OP_3$ is fed back to the inversion input terminal of the operational amplifier $OP_3$ through the feedback impedance element $Zf_2$. It is assumed that impedance of the feedback impedance element $Zf_2$ is $Zf_2$.

One end of the input impedance element $Zi_{21}$ (third input impedance element) is connected to the node $N_2$ and the other end thereof is connected to the node $N_5$. The output voltage of the operational amplifier $OP_1$ is applied to the inversion input terminal of the operational amplifier $OP_3$ through the input impedance element $Zi_{21}$. It is assumed that impedance of the input impedance element $Zi_{21}$ is $Zi_{21}$.

One end of the input impedance element $Zi_{22}$ (fourth input impedance element) is connected to the node $N_4$ and the other end thereof is connected to the node $N_5$. The output voltage of the operational amplifier $OP_2$ is applied to the inversion input terminal of the operational amplifier $OP_3$ through the input impedance element $Zi_{22}$. It is assumed that impedance of the input impedance element $Zi_{22}$ is $Zi_{22}$.

In the amplifying circuit according to this embodiment, the impedance of each impedance element is set to satisfy $Zi_{11}=Zi_{12}=Zi_1$, $Zf_{11}=Zf_{12}=Zf_{13}=Zf_1$, and $Zi_{21}=Zi_{22}=Zi_2$. By the above configuration, each functional configuration of the amplifying circuit of FIG. 4 is realized. In this embodiment, the adder AD is configured by the input impedance elements $Zi_{21}$ and $Zi_{22}$, the operational amplifier $OP_3$, and the feedback impedance element $Zf_2$.

When the gain $A_3$ is sufficiently large and $Zi_2=Zf_2$ is obtained, the output voltage $V_{OUT}$ of the amplifying circuit according to this embodiment is represented by the following formula.

[Formula 5]

$$V_{OUT} = \frac{Z_{f1}}{Z_{i1}}\left(1 + \frac{1}{A_1 A_2}\frac{2Z_{i1}+3Z_{i1}Z_{f1}+Z_{f1}^2}{Z_{i1}^2} + \ldots\right)V_{IN} \quad (5)$$

A first term of the formula 5 is an expectation value of the output voltage $V_{OUT}$ and a portion after a second term of the formula 5 is an error voltage to the expectation value of the output voltage $V_{OUT}$. As known from the formula 5, an error voltage of the second term is inversely proportional to $A_1 \times A_2$. Therefore, the same effect as the effect of the amplifying circuit of FIG. 4 is obtained by the amplifying circuit according to this embodiment.

In the amplifying circuit of FIG. 5, a feedback circuit is formed by the operational amplifier $OP_3$ and the feedback impedance element $Zf_2$. A feedback coefficient of the feedback circuit is $Zi_2/Zf_2$. Therefore, the output voltage $V_{OUT}$ according to this embodiment becomes a voltage that is $Zi_2/Zf_2$ times larger than a voltage obtained by adding the output voltages of the operational amplifiers $OP_1$ and $OP_2$. The formula 5 shows the output voltage $V_{OUT}$ in the case of $Zi_2/Zf_2=1$. However, even in the case of $Zi_2/Zf_2 \neq 1$, the error voltage of the second term is inversely proportional to $A_1 \times A_2$. Therefore, the same effect as the effect of the amplifying circuit of FIG. 4 is obtained without depending on $Zi_2$ and $Zf_2$.

Third Embodiment

Figure 6:
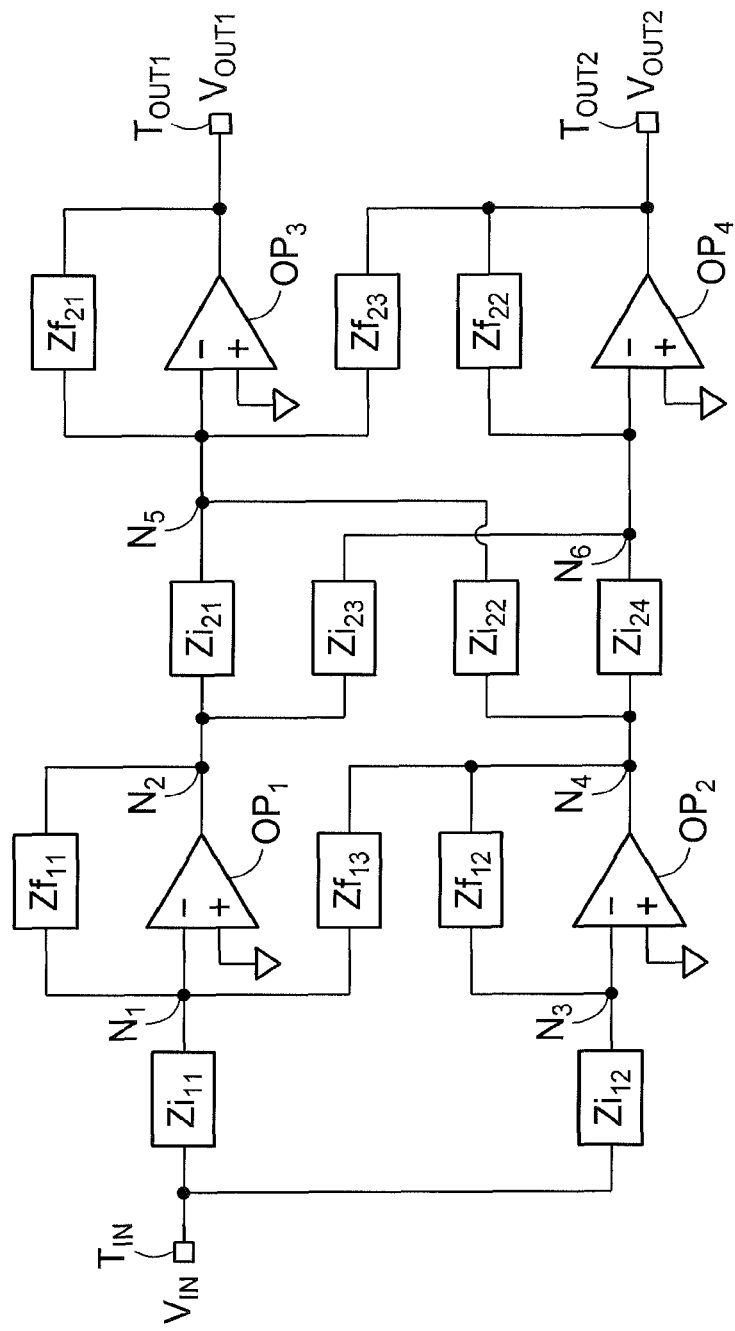
FIG. 6 is a circuit diagram illustrating an amplifying circuit according to a third embodiment.

A third embodiment will be described with reference to FIG. 6. In this embodiment, a modification of the amplifying circuit of FIG. 5 will be described. An amplifying circuit according to this embodiment is an amplifying circuit obtained by connecting the amplifying circuits of FIG. 5 in a cascade manner. FIG. 6 is a circuit diagram illustrating the amplifying circuit according to this embodiment.

As illustrated in FIG. 6, the amplifying circuit according to this embodiment further includes output terminals $T_{OUT1}$ and $T_{OUT2}$, an operational amplifier $OP_4$, input impedance elements $Zi_{23}$ and $Zi_{24}$, and feedback impedance elements $Zf_{21}$, $Zf_{22}$, and $Zf_{23}$. The output terminal $T_{OUT1}$ corresponds to the output terminal $T_{OUT}$ of FIG. 5. The feedback impedance element $Zf_{21}$ corresponds to the feedback impedance element $Zf_2$. The other configuration is the same as the configuration of the amplifying circuit of FIG. 5. In addition, in this embodiment, an operational amplifier $OP_3$ configures an amplifier $A_1$ of an amplifying circuit of a second step and the feedback impedance element $Zf_2$, configures a feedback circuit $\beta_1$ of the amplifying circuit of the second step.

An inversion input terminal (−) of the operational amplifier $OP_4$ (fourth operational amplifier) is connected to a node $N_6$ (sixth node), a non-inversion input terminal (+) thereof is connected to a ground line, and an output terminal thereof is connected to the output terminal $T_{OUT2}$. The node $N_6$ is a connection point of the inversion input terminal of the operational amplifier $OP_4$, the input impedance elements $Zi_{23}$ and $Zi_{24}$, and the feedback impedance element $Zf_{22}$. It is assumed that gain of the operational amplifier $OP_4$ is $A_4$.

One end of the input impedance element $Zi_{23}$ (fifth input impedance element) is connected to a node $N_2$ and the other end thereof is connected to the node $N_6$. An output voltage of an operational amplifier $OP_1$ is applied to the inversion input terminal of the operational amplifier $OP_4$ through the input impedance element $Zi_{23}$. It is assumed that impedance of the input impedance element $Zi_{23}$ is $Zi_{23}$.

One end of the input impedance element $Zi_{24}$ (sixth input impedance element) is connected to a node $N_4$ and the other end thereof is connected to the node $N_6$. An output voltage of an operational amplifier $OP_2$ is applied to the inversion input terminal of the operational amplifier $OP_4$ through the input impedance element $Zi_{24}$. It is assumed that impedance of the input impedance element $Zi_{24}$ is $Zi_{24}$.

One end of the feedback impedance element $Zf_{22}$ (fifth feedback impedance element) is connected to the node $N_6$ and the other end thereof is connected to the output terminal $T_{OUT2}$. An output voltage of the operational amplifier $OP_4$ is fed back to the inversion input terminal of the operational amplifier $OP_4$ through the feedback impedance element $Zf_{22}$. It is assumed that impedance of the feedback impedance element $Zf_{22}$ is $Zf_{22}$.

One end of the feedback impedance element $Zf_{23}$ (sixth feedback impedance element) is connected to a node $N_5$ and the other end thereof is connected to the output terminal $T_{OUT2}$. An output voltage of the operational amplifier $OP_4$ is fed back to the inversion input terminal of the operational amplifier $OP_3$ through the feedback impedance element $Zf_{23}$. It is assumed that impedance of the feedback impedance element $Zf_{23}$ is $Zf_{23}$.

In the amplifying circuit according to this embodiment, the impedance of each impedance element is set to satisfy $Zi_{23}=Zi_{24}=Zi_2$ and $Zf_{22}=Zf_{23}=Zf_2$. In the amplifying circuit according to this embodiment, the operational amplifiers $OP_3$ and $OP_4$ correspond to the amplifiers $A_1$ and $A_2$ of the amplifying circuit of the second step. In addition, the output terminals $T_{OUT1}$ and $T_{OUT2}$ correspond to the nodes $N_2$ and $N_4$ of the amplifying circuit of the second step.

The amplifying circuits of FIG. 5 can be connected in a cascade manner by any number of steps by alternately connecting four impedance elements (configurations corresponding to the input impedance elements $Zi_{21}$ to $Zi_{24}$) and two operational amplifiers and four feedback impedance elements (configurations corresponding to the operational amplifiers $OP_3$ and $OP_4$ and the feedback impedance elements $Zf_{21}$ to $Zf_{23}$) to rear steps of the output terminals $T_{OUT1}$ and $T_{OUT2}$ and connecting an adder AD to a final step. For example, an amplifying circuit in which the amplifying circuits of FIG. 5 are connected in a cascade manner in two steps is configured by connecting the adder AD to the rear steps of the output terminals $T_{OUT1}$ and $T_{OUT2}$.

According to this embodiment, an amplifying circuit having any amplification factor can be realized by connecting the amplifying circuits of FIG. 5 in a cascade manner by any number of steps. In addition, the amplifying circuit according to this embodiment can be applied to a filter circuit having a plurality of orders.

Fourth Embodiment

Figure 7:
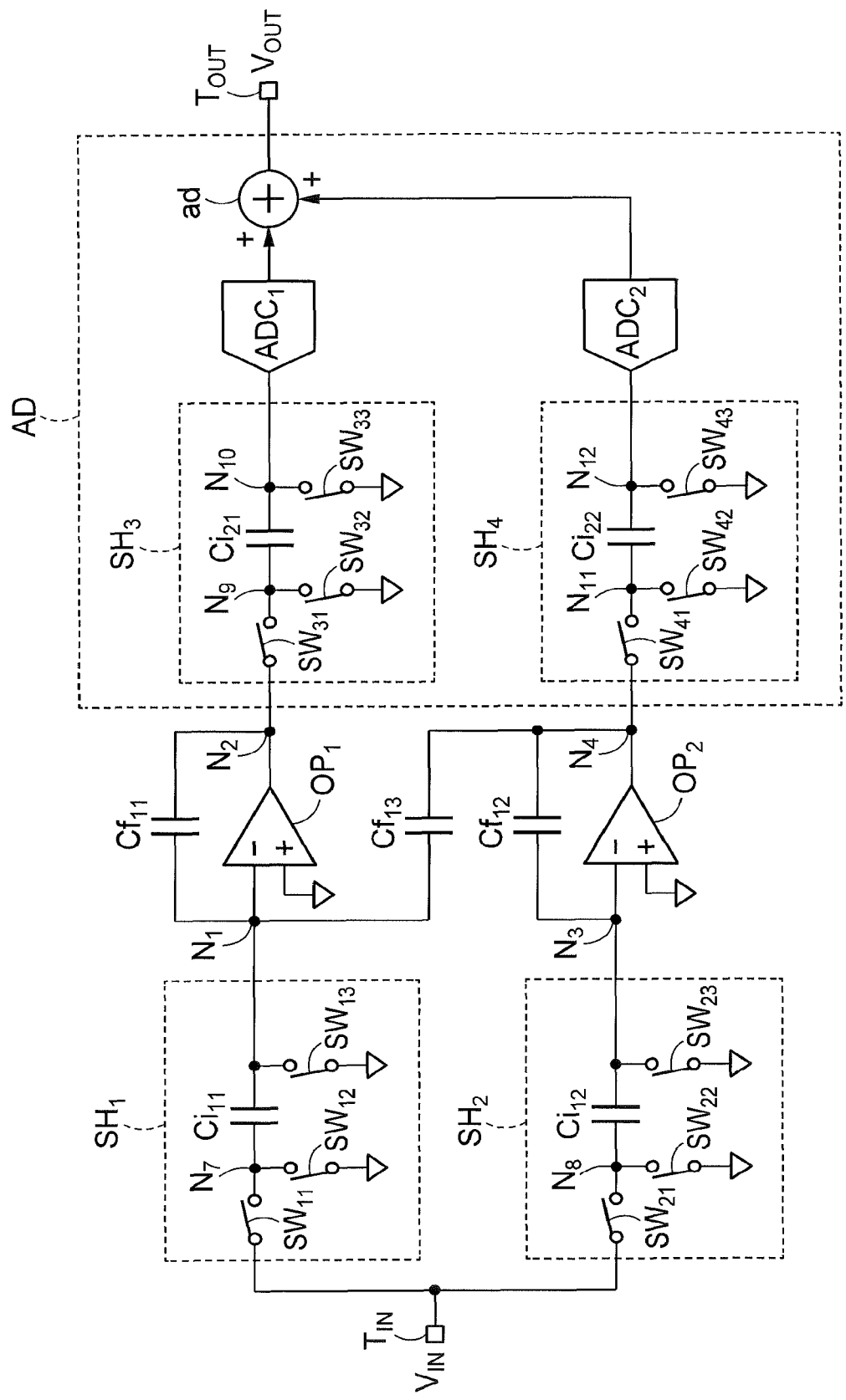
FIG. 7 is a circuit diagram illustrating an amplifying circuit according to a fourth embodiment.

A fourth embodiment will be described with reference to FIG. 7. In this embodiment, another example of the amplifying circuit according to the first embodiment will be described. An amplifying circuit according to this embodiment includes a switched capacitor circuit and has two operation phases of a sample phase and an amplification phase. FIG. 7 is a circuit diagram illustrating the amplifying circuit according to this embodiment.

As illustrated in FIG. 7, the amplifying circuit according to this embodiment includes an input terminal $T_{IN}$, an output terminal $T_{OUT}$, operational amplifiers $OP_1$ and $OP_2$, sample-and-hold circuits $SH_1$ to $SH_4$, feedback capacitative elements $Cf_{11}$ to $Cf_{13}$, AD converters $ADC_1$ and $ADC_2$, and a digital adder ad. The operational amplifiers $OP_1$ and $OP_2$ are the same as the operational amplifiers $OP_1$ and $OP_2$ of FIG. 5.

The sample-and-hold circuit $SH_1$ (first sample-and-hold circuit) is a switched capacitor circuit and corresponds to the input impedance element $Zi_n$ of FIG. 5. The sample-and-hold circuit $SH_1$ includes switches $SW_{11}$ to $SW_{13}$ and a sample capacitative element $Ci_{11}$.

One end of the switch $SW_{11}$ is connected to the input terminal $T_{IN}$ and the other end thereof is connected to a node $N_7$ (seventh node). The node $N_7$ is a connection point of the switches $SW_{11}$ and $SW_{12}$ and the sample capacitative element $Ci_{11}$. One end of the switch $SW_{12}$ is connected to the node $N_7$ and the other end thereof is grounded. One end of the switch $SW_{13}$ is connected to a node $N_1$ and the other end thereof is grounded.

One end of the sample capacitative element $Ci_{11}$ is connected to the node $N_7$ and the other end thereof is connected to the node $N_1$. It is assumed that a capacity value of the sample capacitative element $Ci_{11}$ is $Cl_{11}$.

In the sample-and-hold circuit $SH_1$, in the sample phase, the switches $SW_{11}$ and $SW_{13}$ are turned on and the switch $SW_{12}$ is turned off. As a result, the input voltage $V_{IN}$ is sampled in the sample capacitative element $Ci_{11}$.

In addition, in the sample-and-hold circuit $SH_1$, in the amplification phase, the switches $SW_{11}$ and $SW_{13}$ are turned off and the switch $SW_{12}$ is turned on. As a result, the input voltage $V_{IN}$ sampled in the sample capacitative element $Ci_{11}$ is held.

The sample-and-hold circuit $SH_2$ (second sample-and-hold circuit) is a switched capacitor circuit and corresponds to the input impedance element $Zi_{12}$ of FIG. 5. The sample-and-hold circuit $SH_2$ includes switches $SW_{21}$ to $SW_{23}$ and a sample capacitative element $Ci_{12}$.

One end of the switch $SW_{21}$ is connected to the input terminal $T_{IN}$ and the other end thereof is connected to a node $N_8$ (eighth node). The node $N_8$ is a connection point of the switches $SW_{21}$ and $SW_{22}$ and the sample capacitative element $Ci_{12}$. One end of the switch $SW_{22}$ is connected to the node $N_8$ and the other end thereof is grounded. One end of the switch $SW_{23}$ is connected to a node $N_3$ and the other end thereof is grounded.

One end of the sample capacitative element $Ci_{12}$ is connected to the node $N_8$ and the other end thereof is connected to the node $N_3$. It is assumed that a capacity value of the sample capacitative element $Ci_{12}$ is $Ci_{12}$.

In the sample-and-hold circuit $SH_2$, in the sample phase, the switches $SW_{21}$ and $SW_{23}$ are turned on and the switch $SW_{22}$ is turned off. As a result, the input voltage $V_{IN}$ is sampled in the sample capacitative element $Ci_{12}$.

In addition, in the sample-and-hold circuit $SH_2$, in the amplification phase, the switches $SW_{21}$ and $SW_{23}$ are turned off and the switch $SW_{22}$ is turned on. As a result, the input voltage $V_{IN}$ sampled in the sample capacitative element $Ci_{12}$ is held.

One end of the feedback capacitative element $Cf_{11}$ is connected to the node $N_1$ and the other end thereof is connected to the node $N_2$. The feedback capacitative element $Cf_{11}$ corresponds to the feedback impedance element $Zf_{11}$ of FIG. 5. An output voltage of the operational amplifier $OP_1$ is fed back to an inversion input terminal of the operational amplifier $OP_1$ through the feedback capacitative element $Cf_{11}$. It is assumed that a capacity value of the feedback capacitative element $Cf_{11}$ is $Cf_{11}$.

One end of the feedback capacitative element $Cf_{12}$ is connected to the node $N_3$ and the other end thereof is connected to the node $N_4$. The feedback capacitative element $Cf_{12}$ corresponds to the feedback impedance element $Zf_{12}$ of FIG. 5. An output voltage of the operational amplifier $OP_2$ is fed back to an inversion input terminal of the operational amplifier $OP_2$ through the feedback capacitative element $Cf_{12}$. It is assumed that a capacity value of the feedback capacitative element $Cf_{12}$ is $Cf_{12}$.

One end of the feedback capacitative element $Cf_{13}$ is connected to the node $N_1$ and the other end thereof is connected to the node $N_3$. The feedback capacitative element $Cf_{13}$ corresponds to the feedback impedance element $Zf_{13}$ of FIG. 5. The output voltage of the operational amplifier $OP_2$ is fed back to the inversion input terminal of the operational amplifier $OP_1$ through the feedback capacitative element $Cf_{13}$. It is assumed that a capacity value of the feedback capacitative element $Cf_{13}$ is $Cf_{13}$.

The sample-and-hold circuit $SH_3$ (third sample-and-hold circuit) is a switched capacitor circuit and includes switches $SW_{31}$ to $SW_{33}$ and a sample capacitative element $Ci_{21}$.

One end of the switch $SW_{31}$ is connected to the node $N_2$ and the other end thereof is connected to a node $N_9$ (ninth node). The node $N_9$ is a connection point of the switches $SW_{31}$ and $SW_{32}$ and the sample capacitative element $Ci_{21}$. One end of the switch $SW_{32}$ is connected to the node $N_9$ and the other end thereof is grounded. One end of the switch $SW_{33}$ is connected to a node $N_{10}$ (tenth node) and the other end thereof is grounded. The node $N_{10}$ is a connection point of the switch $SW_{32}$, the sample capacitative element $Ci_{21}$, and an input terminal of the AD converter $ADC_1$.

One end of the sample capacitative element $Ci_{21}$ is connected to the node $N_9$ and the other end thereof is connected to the node $N_{10}$. It is assumed that a capacity value of the sample capacitative element $Ci_{21}$ is $Ci_{21}$.

In the sample-and-hold circuit $SH_3$, in the amplification phase, the switches $SW_{31}$ and $SW_{33}$ are turned on and the switch $SW_{32}$ is turned off. As a result, the output voltage of the operational amplifier $OP_1$ is sampled in the sample capacitative element $Ci_{21}$.

In addition, in the sample-and-hold circuit $SH_3$, in the sample phase, the switches $SW_{31}$ and $SW_{33}$ are turned off and the switch $SW_{32}$ is turned on. As a result, the output voltage of the operational amplifier $OP_1$ sampled in the sample capacitative element $Ci_{21}$ is held and is input to the AD converter $ADC_1$.

An input terminal of the AD converter $ADC_1$ (first AD converter) is connected to the node $N_{10}$ and an output terminal thereof is connected to an input terminal of the digital adder ad. In the amplification phase, the AD converter $ADC_1$ receives an output voltage of the sample-and-hold circuit $SH_3$, executes AD conversion on the received voltage, and outputs a digital signal. The digital signal output by the AD converter $ADC_1$ is input to the digital adder ad.

The sample-and-hold circuit $SH_4$ (fourth sample-and-hold circuit) is a switched capacitor circuit and includes switches $SW_{41}$ to $SW_{43}$ and a sample capacitative element $Ci_{22}$.

One end of the switch $SW_{41}$ is connected to the node $N_4$ and the other end thereof is connected to a node $N_{11}$ (eleventh node). The node $N_{11}$ is a connection point of the switches $SW_{41}$ and $SW_{42}$ and the sample capacitative element $Ci_{22}$. One end of the switch $SW_{42}$ is connected to the node $N_{11}$ and the other end thereof is grounded. One end of the switch $SW_{43}$ is connected to a node $N_{12}$ (twelfth node) and the other end thereof is grounded. The node $N_{12}$ is a connection point of the switches $SW_{42}$, the sample capacitative element $Ci_{22}$, and an input terminal of the AD converter $ADC_2$.

One end of the sample capacitative element $Ci_{22}$ is connected to the node $N_{11}$ and the other end thereof is connected to the node $N_{12}$. It is assumed that a capacity value of the sample capacitative element $Ci_{22}$ is $Ci_{22}$.

In the sample-and-hold circuit $SH_4$, in the amplification phase, the switches $SW_{41}$ and $SW_{43}$ are turned on and the switch $SW_{42}$ is turned off. As a result, the output voltage of the operational amplifier $OP_2$ is sampled in the sample capacitative element $Ci_{22}$.

In addition, in the sample-and-hold circuit $SH_4$, in the sample phase, the switches $SW_{41}$ and $SW_{43}$ are turned off and the switch $SW_{42}$ is turned on. As a result, the output voltage of the operational amplifier $OP_2$ sampled in the sample capacitative element $Ci_{22}$ is held and is input to the AD converter $ADC_2$.

An input terminal of the AD converter $ADC_2$ (second AD converter) is connected to the node $N_{12}$ and an output terminal thereof is connected to the input terminal of the digital adder ad. In the amplification phase, the AD converter $ADC_2$ receives an output voltage of the sample-and-hold circuit $SH_4$, executes AD conversion on the received voltage, and outputs a digital signal. The digital signal output by the AD converter $ADC_2$ is input to the digital adder ad.

The digital adder ad receives the digital signals output by the AD converters $ADC_1$ and $ADC_2$. The digital adder ad adds the received digital signals and outputs an added digital signal. The output signal of the digital adder ad becomes the output voltage $V_{OUT}$ in this embodiment. For this reason, in this embodiment, the output voltage $V_{OUT}$ becomes the digital signal.

In the amplifying circuit according to this embodiment, the capacity value of each capacitative element is set to satisfy $Ci_{11}=Ci_{12}$ $Cf_{11}=Cf_{12}=Cf_{13}=Cf_1$, and $Ci_{21}=Ci_{22}=Ci_2$. By the above configuration, each functional configuration of the amplifying circuit of FIG. 4 is realized. In this embodiment, the adder AD is configured by the sample-and-hold circuits $SH_3$ and $SH_4$, the AD converters $ADC_1$ and $ADC_2$, and the digital adder ad.

The amplifying circuit amplifies the input voltage $V_{IN}$ at a predetermined interval of time by repeating the sample phase and the amplification phase alternately. Here, if resolutions of the AD converters $ADC_1$ and $ADC_2$ are set infinitely, the output voltage $V_{OUT}$ is represented by the following formula, from the law of conservation of charge.

[Formula 6]

$$V_{OUT} = \frac{C_{i1}}{C_{f1}}\left(1 - \frac{2}{A_1 A_2} + \ldots\right) V_{in} \quad (6)$$

A first term of the formula 6 is an expectation value of the output voltage $V_{OUT}$ and a portion after a second term of the formula 6 is an error voltage to the expectation value of the output voltage $V_{OUT}$. As known from the formula 6, an error voltage of the second term is inversely proportional to $A_1 \times A_2$. Therefore, the same effect as the effect of the amplifying circuit of FIG. 4 is obtained by the amplifying circuit according to this embodiment.

In this embodiment, the magnitude of the input signal of the AD converter $ADC_1$ is smaller than the magnitude of the input signal of the AD converter $ADC_2$. For this reason, the resolution of the AD converter $ADC_1$ may be smaller than the resolution of the AD converter $ADC_2$.

Fifth Embodiment

Figure 8:
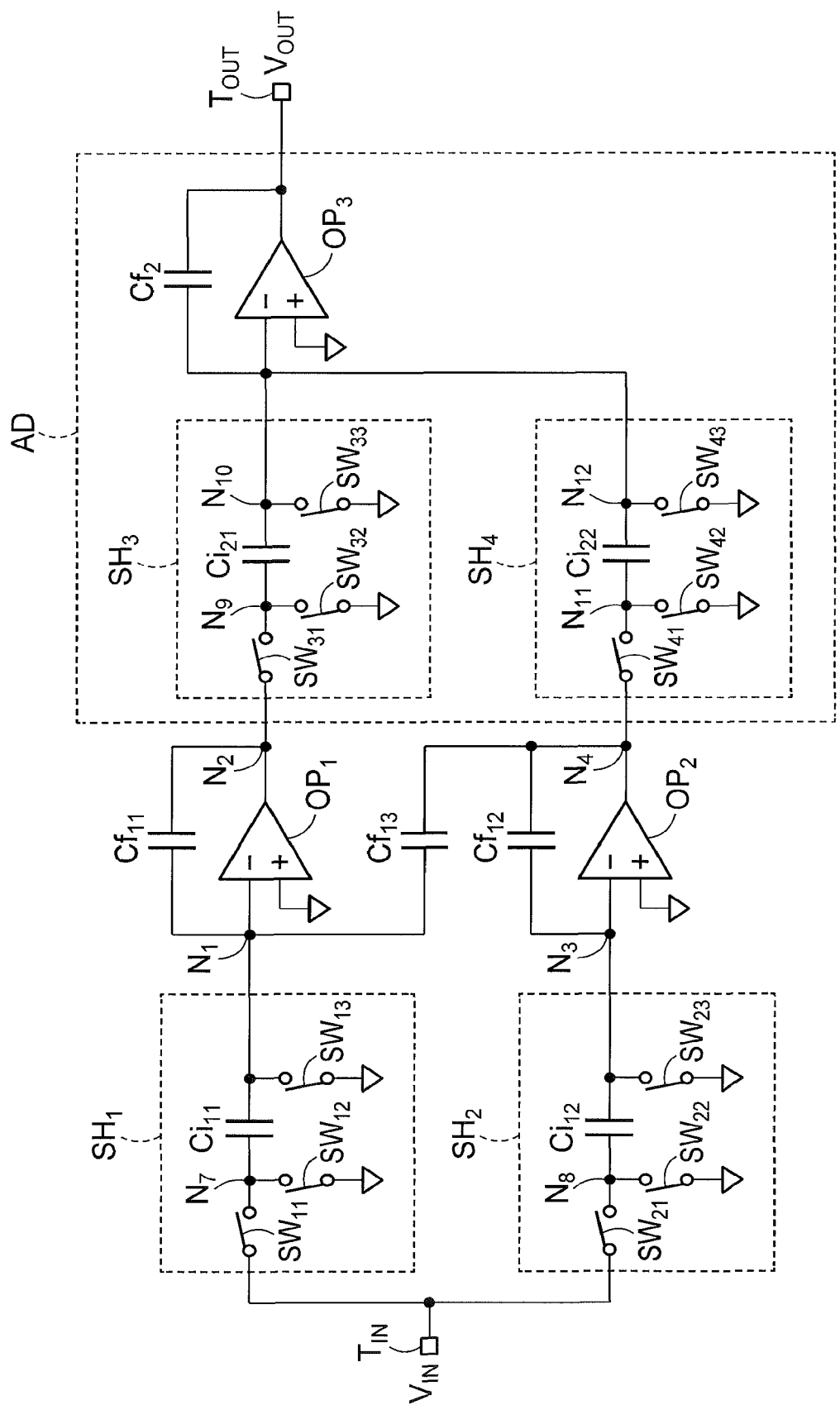
FIG. 8 is a circuit diagram illustrating an amplifying circuit according to a fifth embodiment.

A fifth embodiment will be described with reference to FIG. 8. In this embodiment, a modification of the amplifying circuit of FIG. 7 will be described. FIG. 8 is a circuit diagram illustrating an amplifying circuit according to this embodiment. As illustrated in FIG. 8, the amplifying circuit according to this embodiment includes an operational amplifier $OP_3$ and a feedback capacitative element $Cf_2$, instead of the AD converters $ADC_1$ and $ADC_2$ and the digital adder ad of FIG. 7. The other configuration is the same as the configuration of the amplifying circuit of FIG. 7.

An inversion input terminal (−) of the operational amplifier $OP_3$ is connected to nodes $N_{10}$ and $N_{12}$, a non-inversion input terminal (+) thereof is grounded, and an output terminal thereof is connected to an output terminal $T_{OUT}$. It is assumed that gain of the operational amplifier $OP_3$ is $A_3$. It is assumed that the gain $A_3$ is sufficiently large.

One end of the feedback capacitative element $Cf_2$ is connected to the nodes $N_{10}$ and $N_{12}$ and the other end thereof is connected to the output terminal $T_{OUT}$. An output voltage of the operational amplifier $OP_3$ is fed back to the inversion input terminal of the operational amplifier $OP_3$ through the feedback capacitative element $Cf_2$. It is assumed that a capacity value of the feedback capacitative element $Cf_2$ is $Cf_2$.

In this embodiment, an adder AD is configured by the sample-and-hold circuits $SH_3$ and $SH_4$, the operational amplifier $OP_3$, and the feedback capacitative element $Cf_2$.

In the amplifying circuit of FIG. 8, a feedback circuit is formed by the operational amplifier $OP_3$ and the feedback capacitative element $Cf_2$. A feedback coefficient of the feedback circuit is $Ci_2/Cf_2$. Therefore, the output voltage $V_{OUT}$ according to this embodiment becomes a voltage that is $Ci_2/Cf_2$ times larger than a voltage obtained by adding the output voltages of the operational amplifiers $OP_1$ and $OP_2$. Similar to the amplifying circuit of FIG. 7, in the amplifying circuit according to this embodiment, an error voltage of a second term is inversely proportional to $A_1 \times A_2$ without depending on $Ci_2$ and $Cf_2$. Therefore, the same effect as the effect of the amplifying circuit of FIG. 4 is obtained by the amplifying circuit according to this embodiment.

Sixth Embodiment

Figure 9:
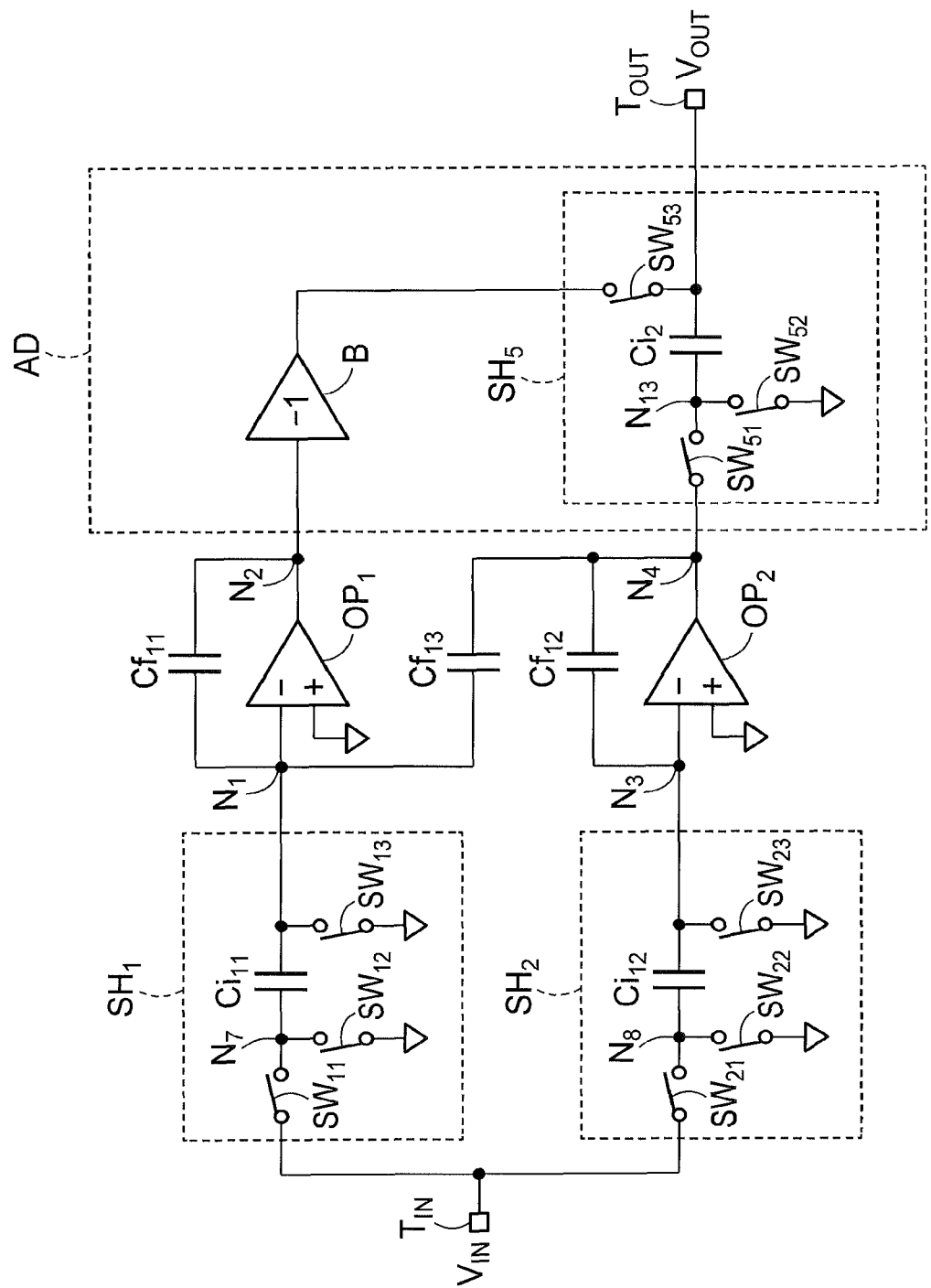
FIG. 9 is a circuit diagram illustrating an amplifying circuit according to a sixth embodiment.

A sixth embodiment will be described with reference to FIG. 9. In this embodiment, another modification of the amplifying circuit of FIG. 7 will be described. FIG. 9 is a circuit diagram illustrating an amplifying circuit according to this embodiment. As illustrated in FIG. 9, the amplifying circuit according to this embodiment includes a buffer circuit B and a sample-and-hold circuit $SH_5$, instead of the sample-and-hold circuits $SH_3$ and $SH_4$, the AD converters $ADC_1$ and $ADC_2$, and the digital adder ad of FIG. 7. The other configuration is the same as the configuration of the amplifying circuit of FIG. 7.

An input terminal of the buffer circuit B is connected to a node $N_2$ and an output terminal thereof is connected to one end of a switch $SW_{53}$. In an amplification phase, the buffer circuit B receives an output voltage of an operational amplifier $OP_1$, inverts the received voltage, and outputs the voltage. That is, gain of the buffer circuit B is −1.

The sample-and-hold circuit $SH_5$ (fifth sample-and-hold circuit) is a switched capacitor circuit and includes switches $SW_{51}$ to $SW_{53}$ and a sample capacitative element $Ci_2$.

One end of the switch $SW_{51}$ is connected to a node $N_4$ and the other end thereof is connected to a node $N_{13}$ (thirteenth node). The node $N_{13}$ is a connection point of the switches $SW_{51}$ and $SW_{52}$ and the sample capacitative element $Ci_2$. One end of the switch $SW_{52}$ is connected to the node $N_{13}$ and the other end thereof is grounded. One end of the switch $SW_{53}$ is connected to an output terminal of the buffer circuit B and the other end thereof is connected to an output terminal $T_{OUT}$.

One end of the sample capacitative element $Ci_2$ is connected to the node $N_{13}$ and the other end thereof is connected to the output terminal $T_{OUT}$. It is assumed that a capacity value of the capacitative element $Ci_2$ is $Ci_2$.

In the sample-and-hold circuit $SH_5$, in an amplification phase, the switches $SW_{51}$ and $SW_{53}$ are turned on and the switch $SW_{52}$ is turned off. As a result, an output voltage of the operational amplifier $OP_2$ and an output voltage of the buffer circuit B are sampled in the sample capacitative element $Ci_2$.

The output voltage of the buffer circuit B is obtained by inverting an output voltage of the operational amplifier $OP_1$. In addition, the output voltage of the buffer circuit B is input to the sample capacitative element $Ci_2$ from the side opposite to the input side of the output voltage of the operational amplifier $OP_2$. As a result, a voltage obtained by adding the output voltages of the operational amplifiers $OP_1$ and $OP_2$ is sampled in the sample capacitative element $Ci_2$. As such, in this embodiment, an adder AD is configured by the buffer circuit B and the sample-and-hold circuit $SH_5$.

In addition, in the sample-and-hold circuit $SH_5$, in a sample phase, the switches $SW_{51}$ and $SW_{53}$ are turned off and the switch $SW_{52}$ is turned on. As a result, the voltage (sum of the output voltage of the operational amplifier $OP_2$ and the output voltage of the buffer circuit B) sampled in the sample capacitative element $Ci_2$ is held and is output as an output voltage $V_{OUT}$. As such, according to the amplifying circuit according to this embodiment, the adder AD can be configured using the buffer circuit B.

Seventh Embodiment

Figure 10:
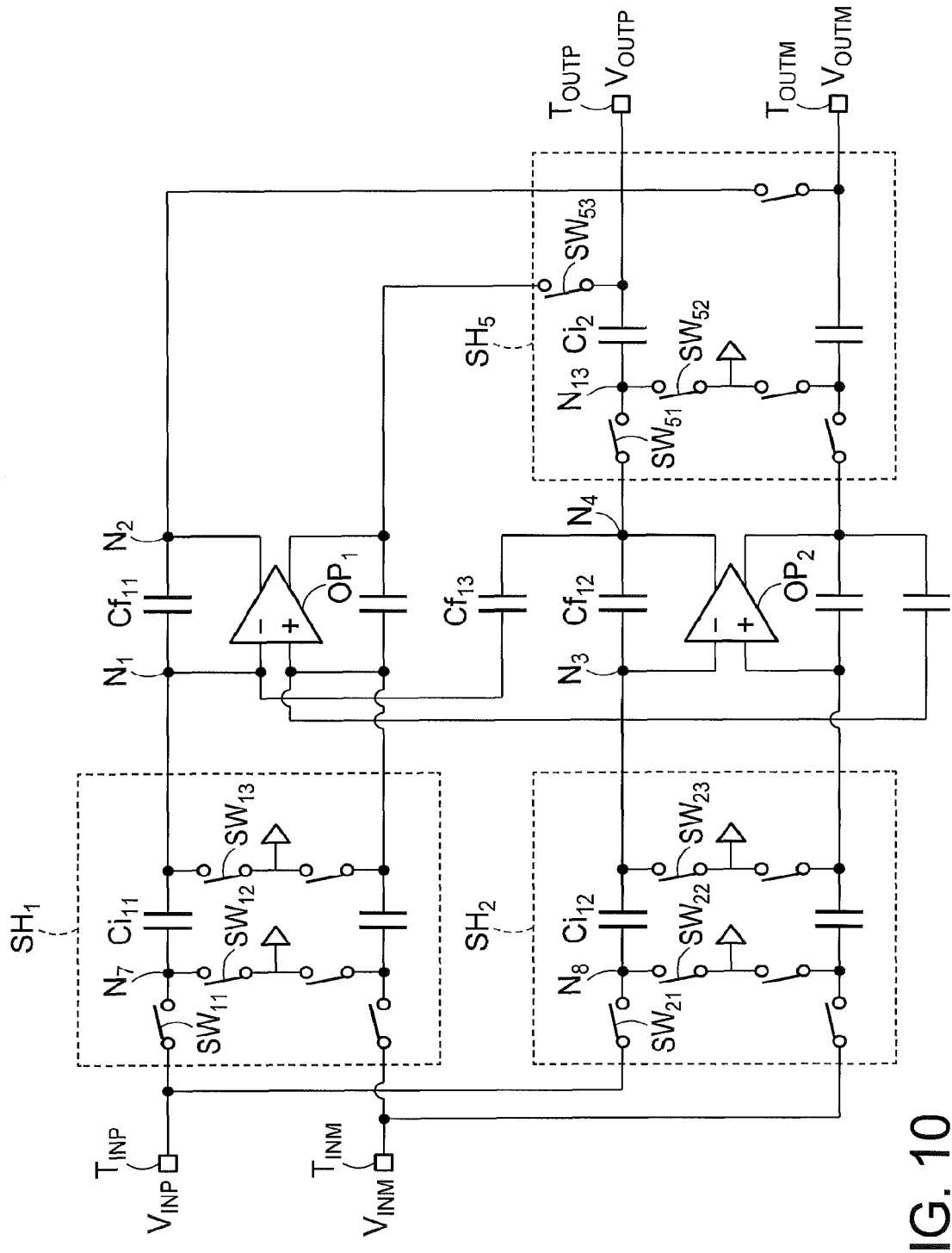
FIG. 10 is a circuit diagram illustrating an amplifying circuit according to a seventh embodiment.

A seventh embodiment will be described with reference to FIG. 10. In this embodiment, a modification of the amplifying circuit of FIG. 9 will be described. FIG. 10 is a circuit diagram illustrating an amplifying circuit according to this embodiment. As illustrated in FIG. 10, the amplifying circuit according to this embodiment is obtained by changing the configuration of the amplifying circuit of FIG. 9 to a differential configuration and includes an amplifying circuit of the inversion input side and an amplifying circuit of the non-inversion input side.

The amplifying circuit (hereinafter, referred to as the "amplifying circuit P") of the inversion input side includes an input terminal $T_{INP}$ that receives an input voltage $V_{INP}$ and an output terminal $T_{OUTP}$ that outputs an output voltage $V_{OUTP}$. The amplifying circuit (hereinafter, referred to as the "amplifying circuit M") of the non-inversion input side includes an input terminal $T_{INM}$ that receives an input voltage $V_{INM}$ and an output terminal $T_{OUTM}$ that outputs an output voltage $V_{OUTM}$. Different from the amplifying circuit of FIG. 9, both the amplifying circuits P and M do not include a buffer circuit B.

An inversion input terminal of an operational amplifier $OP_1$ is connected to a node $N_1$ of the amplifying circuit P and a non-inversion input terminal thereof is connected to a node $N_1$ of the amplifying circuit M. In addition, an inversion output terminal of the operational amplifier $OP_1$ is connected to a node $N_2$ of the amplifying circuit P and a non-inversion output terminal thereof is connected to a node $N_2$ of the amplifying circuit M.

An inversion input terminal of an operational amplifier $OP_2$ is connected to a node $N_3$ of the amplifying circuit P and a non-inversion input terminal thereof is connected to a node $N_3$ of the amplifying circuit M. In addition, an inversion output terminal of the operational amplifier $OP_2$ is connected to a node $N_4$ of the amplifying circuit P and a non-inversion output terminal thereof is connected to a node $N_4$ of the amplifying circuit M.

In addition, in this embodiment, the node $N_2$ of the amplifying circuit P is connected to one end of a switch $SW_{53}$ of the amplifying circuit M and the node $N_2$ of the amplifying circuit M is connected to one end of a switch $SW_{53}$ of the amplifying circuit P. That is, an output voltage of the operational amplifier $OP_1$ of the amplifying circuit P is input to a sample capacitative element $Ci_2$ of the amplifying circuit M and an output voltage of the operational amplifier $OP_1$ of the amplifying circuit M is input to a sample capacitative element $Ci_2$ of the amplifying circuit P.

By such a configuration, the output voltage of the operational amplifier $OP_1$ can be inverted and can be input to the sample capacitative element $Ci_2$ of the amplifying circuit P, without using the buffer circuit B in which gain is −1. Likewise, the output voltage of the operational amplifier $OP_1$ can be inverted and can be input to the sample capacitative element $Ci_2$ of the amplifying circuit M. Therefore, in this embodiment, an adder AD is configured by a sample-and-hold circuit $SH_5$.

Eighth Embodiment

Figure 11:
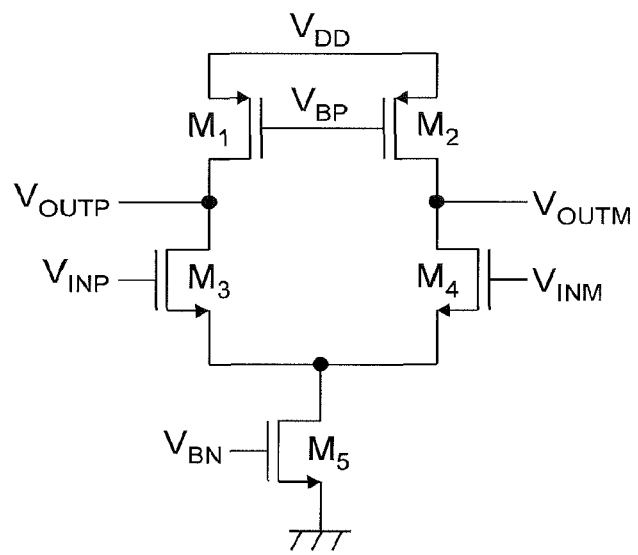
FIG. 11 is a circuit diagram illustrating an operational amplifier according to an eighth embodiment.

An eighth embodiment will be described with reference to FIG. 11. In this embodiment, an example of an operational amplifier configuring an amplifying circuit will be described. FIG. 11 is a circuit diagram illustrating the operational amplifier according to this embodiment. As illustrated in FIG. 11, the operational amplifier according to this embodiment includes transistors $M_1$ to $M_5$. Hereinafter, an inversion input terminal of the operational amplifier is called an input terminal $T_{INP}$, a non-inversion input terminal thereof is called an input terminal $T_{INM}$, an inversion output terminal thereof is called an output terminal $T_{OUTP}$, and a non-inversion output terminal thereof is called an output terminal $T_{OUTM}$. In FIG. 11, $V_{DD}$ shows a power-supply voltage.

The transistor $M_1$ is a P-channel MOS transistor (hereinafter, referred to as the "PMOS"). A source terminal of the transistor $M_1$ is connected to a power line, a drain terminal thereof is connected to the output terminal $T_{OUTP}$, and a gate terminal thereof is connected to a gate terminal of the transistor $M_2$. A bias voltage $V_{BP}$ is applied to the gate terminal.

The transistor $M_2$ is a PMOS. A source terminal of the transistor $M_2$ is connected to a power line, a drain terminal thereof is connected to the output terminal $T_{OUTM}$, and a gate terminal thereof is connected to the gate terminal of the transistor $M_1$. The bias voltage $V_{BP}$ is applied to the gate terminal.

The transistor $M_3$ is an N-channel MOS transistor (hereinafter, referred to as the "NMOS"). A source terminal of the transistor $M_3$ is connected to a drain terminal of the transistor $M_5$, a drain terminal thereof is connected to the output terminal $T_{OUTP}$, and a gate terminal thereof is connected to the input terminal $T_{INP}$.

The transistor $M_4$ is an NMOS. A source terminal of the transistor $M_4$ is connected to a drain terminal of the transistor $M_5$, a drain terminal thereof is connected to the output terminal $T_{OUTM}$, and a gate terminal thereof is connected to the input terminal $T_{INM}$.

The transistor $M_5$ is an NMOS. A source terminal of the transistor $M_5$ is grounded, a drain terminal thereof is connected to the source terminals of the transistors $M_3$ and $M_4$, and a bias voltage $V_{BN}$ is applied to a gate terminal thereof.

The amplifying circuit according to each embodiment described above can improve the gain of the main amplifier in an equivalent manner by connecting the main amplifier and the subsidiary amplifier. For this reason, even when the operational amplifier having the simple configuration illustrated in FIG. 11 is used as the amplifier, the input voltage $V_{IN}$ can be amplified with high precision by suppressing an error voltage.

The operational amplifier of FIG. 11 has the differential configuration. However, the operational amplifier may have a single-phase configuration. In addition, the operational amplifier of FIG. 11 is configured by the MOS transistors. However, the operational amplifier may be configured by transistors of a different type such as bipolar transistors.

Ninth Embodiment

Figure 12:
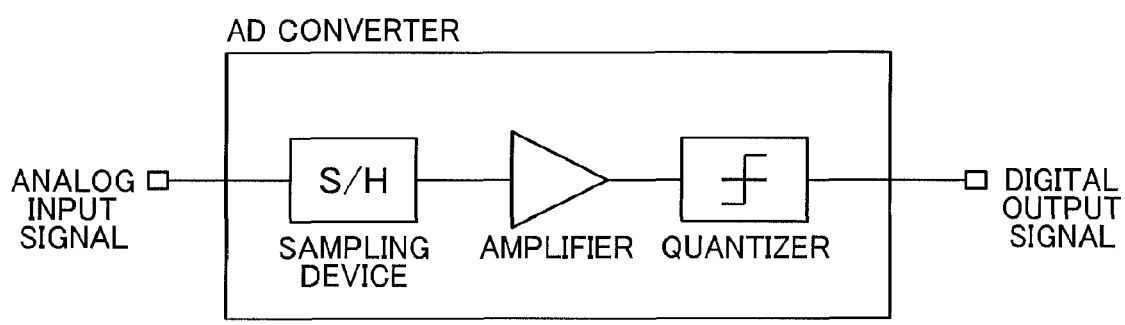
FIG. 12 is a functional block diagram illustrating an AD conversion circuit according to a ninth embodiment.

An AD converter according to a ninth embodiment will be described with reference to FIG. 12. FIG. 12 is a functional block diagram illustrating the AD converter according to this embodiment. The AD converter according to this embodiment includes any one of the amplifying circuits according to the first to seventh embodiments. As illustrated in FIG. 12, the AD converter includes a sampling device, an amplifier, and a quantizer.

The sampling device samples an input analog signal at a predetermined interval of time and outputs a sampled signal. The amplifier amplifies an output signal of the sampling device with predetermined gain and outputs the output signal. The quantizer quantizes the output signal of the amplifier and outputs a digital signal.

In the AD converter according to this embodiment, the amplifier is configured by any one of the amplifying circuits according to the first to seventh embodiments. In addition, a function of the sampling device may be realized by a sample-and-hold circuit SH of the amplifying circuit. An output signal $V_{OUT}$ of the amplifying circuit becomes the output signal of the amplifier and is quantized by the quantizer.

The amplifying circuit according to each embodiment described above can improve gain of a main amplifier in an equivalent manner by connecting the main amplifier and a subsidiary amplifier. In addition, an amplification error can be suppressed from occurring due to mismatching between the main amplifier and the subsidiary amplifier. Because the AD converter according to this embodiment includes the amplifying circuit, high-precision AD conversion is enabled.

Tenth Embodiment

Figure 13:
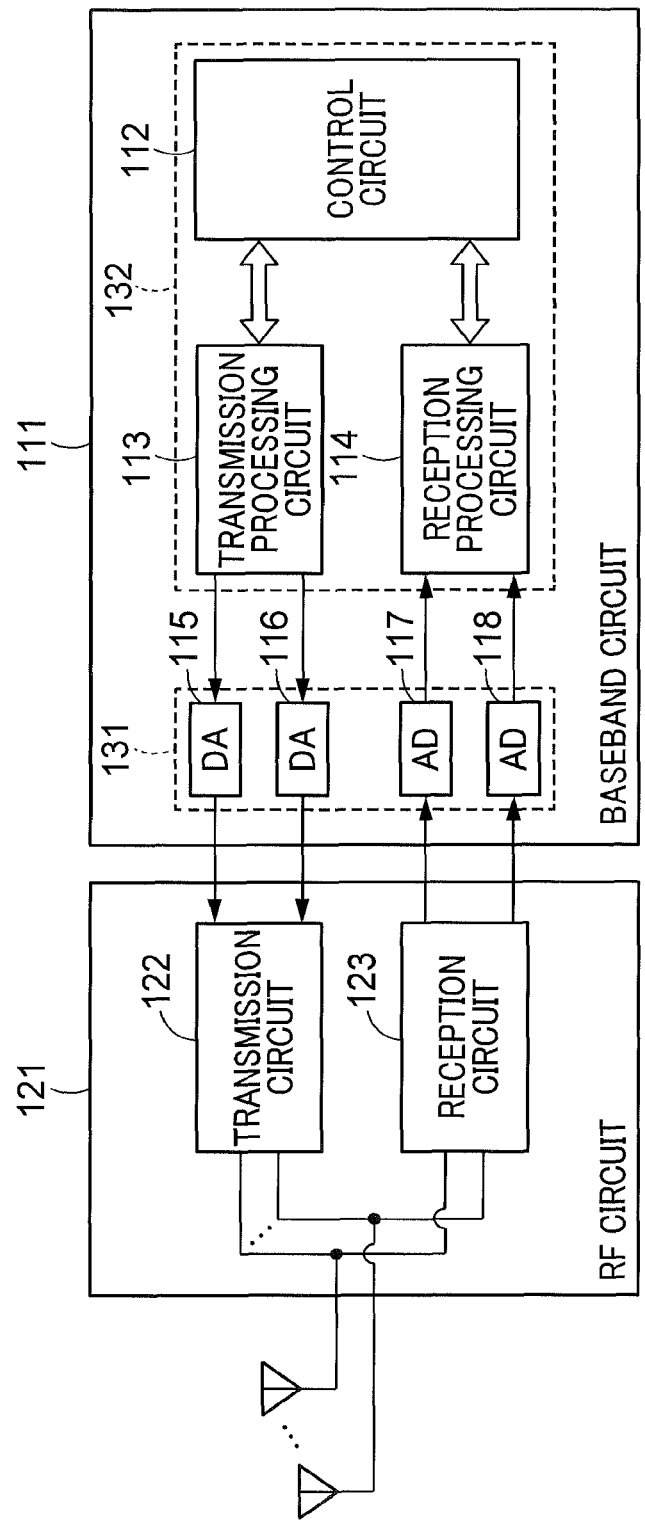
FIG. 13 is a diagram illustrating a hardware configuration of a wireless communication apparatus according to a tenth embodiment.

An integrated circuit and a wireless communication apparatus according to a tenth embodiment will be described with reference to FIG. 13. FIG. 13 is a diagram illustrating a hardware configuration of the wireless communication apparatus according to this embodiment. The hardware configuration is exemplary and various changes can be made in the hardware configuration.

As illustrated in FIG. 13, the wireless communication apparatus according to this embodiment a baseband circuit 111, an RF circuit 121, and antennas.

The baseband circuit 111 includes a control circuit 112, a transmission processing circuit 113, a reception processing circuit 114, DA converters 115 and 116, and AD converters 117 and 118. The RF circuit 121 and the baseband circuit 111 may be configured as an integrated circuit (IC) of one chip and may be configured by different chips.

The baseband circuit 111 is a baseband LSI or a baseband IC of one chip, for example. In addition, as shown by a broken line in FIG. 13, the baseband circuit 111 may include ICs of two chips of an IC 131 and an IC 132. In an example of FIG. 13, the IC 131 includes the DA converters 115 and 116 and the AD converters 117 and 118. The IC 132 includes the control circuit 112, the transmission processing circuit 113, and the reception processing circuit 114. A method of dividing configurations included in each IC is not limited thereto. In addition, the baseband circuit 111 may be configured by three or more ICs.

The control circuit 112 executes processing relating to communication with other terminals (including a base station). Specifically, the control circuit 112 handles MAC frames of three types of a data frame, a control frame, and a management frame and executes various processing defined in a MAC layer. In addition, the control circuit 112 may execute processing of upper layers (for example, a TCP/IP, a UDP/IP, and an application layer of an upper layer thereof) of the MAC layer.

The transmission processing circuit 113 receives the MAC frame from the control circuit 112. The transmission processing circuit 113 executes addition of a preamble and a PHY header to the MAC frame and encoding and modulation of the MAC frame. As a result, the transmission processing circuit 113 converts the MAC frame into a PHY packet.

The DA converters 115 and 116 execute DA conversion on the PHY packet output by the transmission processing circuit 113. In the example of FIG. 13, the DA converters are provided in two systems and execute parallel processing. However, only the DA converter may be provided or the DA converters may be provided by the number of antennas.

The RF circuit 121 is an RF analog IC or a high frequency IC of one chip, for example. The RF circuit 121 may be configured as one chip with the baseband circuit 111. Alternatively, the RF circuit 121 may be configured by two chips of an IC including a transmission circuit 122 and an IC including a reception processing circuit. The RF circuit 121 includes the transmission circuit 122 and a reception circuit 123.

The transmission circuit 122 executes analog signal processing on the PHY packet on which the DA conversion has been executed by the DA converters 115 and 116. An analog signal output by the transmission circuit 122 is transmitted wirelessly via an antenna. The transmission circuit 122 includes a transmission filter, a mixer, and a power amplifier (PA).

The transmission filter extracts a signal of a desired band from a signal of the PHY packet on which the DA conversion has been executed by the DA converters 115 and 116. The mixer up-converts a signal after filtering by the transmission filter into a radio frequency, using a signal of a constant frequency supplied from an oscillation device. The preamble amplifies a signal after the up-conversion. A signal after the amplification is supplied to the antenna and a radio signal is transmitted.

The reception circuit 123 executes analog signal processing on a signal received by the antenna. A signal output by the reception circuit 123 is input to the AD converters 117 and 118. The reception circuit 123 includes a low noise amplifier (LNA), a mixer, and a reception filter.

The LNA amplifies the signal received by the antenna. The mixer down-converts the signal after the amplification into a baseband signal, using the signal of the constant frequency supplied from the oscillation device. The reception filter extracts a signal of a desired band from a signal after the down-conversion. The extracted signal is input to the AD converters 117 and 118.

The AD converters 117 and 118 execute AD conversion on an input signal from the reception circuit 123. In the example of FIG. 13, the AD converters are provided in two systems and execute parallel processing. However, only one AD converter may be provided or the AD converters may be provided by the number of antennas.

The wireless communication apparatus according to this embodiment includes the AD converters according to the ninth embodiment as the AD converters 117 and 118. Because high-precision AD conversion is enabled in the AD converter according to the fourth embodiment, reception processing of a radio signal having high reliability is enabled in the wireless communication apparatus according to this embodiment.

The reception processing circuit 114 receives the PHY packet on which the AD conversion has been executed by the AD converters 117 and 118. The reception processing circuit 114 executes demodulation and decoding of the PHY packet and removing of the preamble and the PHY header from the PHY packet. As a result, the reception processing circuit 114 converts the PHY packet into the MAC frame. A frame after processing by the reception processing circuit 114 is input to the control circuit 112.

In the example of FIG. 13, the DA converters 115 and 116 and the AD converters 117 and 118 are arranged in the baseband circuit 111. However, the DA converters 115 and 116 and the AD converters 117 and 118 may be configured to be arranged in the RF circuit 121.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An amplifying circuit comprising:
an input terminal to receive an input voltage;
an output terminal to output an output voltage;
a first operational amplifier including an inversion input terminal connected to a first node, a non-inversion input terminal, and an output terminal connected to a second node;
a first input impedance element having one end connected to the input terminal and another end connected to the first node;
a first feedback impedance element having one end connected to the first node and another end connected to the second node;
a second operational amplifier including an inversion input terminal connected to a third node, a non-inversion input terminal, and an output terminal connected to a fourth node;
a second input impedance element having one end connected to the input terminal and another end connected to the third node;
a second feedback impedance element having one end connected to the third node and another end connected to the fourth node;
a third feedback impedance element having one end connected to the first node and another end connected to the fourth node; and
an adder to add an output voltage of the first operational amplifier and an output voltage of the second operational amplifier and outputs an added output voltage.

2. The amplifying circuit according to claim 1, wherein the first input impedance element is a first sample-and-hold circuit to sample the input voltage, and
the second input impedance element is a second sample-and-hold circuit to sample the input voltage.

3. The amplifying circuit according to claim 1, wherein the first feedback impedance element, the second feedback impedance element, and the third feedback impedance element are capacitative elements.

4. The amplifying circuit according to claim 1, wherein the adder includes
a third operational amplifier including an inversion input terminal connected to a fifth node, a non-inversion input terminal, and an output terminal connected to the output terminal of the amplifying circuit,
a third input impedance element having one end connected to the second node and another end connected to the fifth node,
a fourth input impedance element having one end connected to the fourth node and another end connected to the fifth node, and
a fourth feedback impedance element having one end connected to the fifth node and another end connected to the output terminal of the amplifying circuit.

5. The amplifying circuit according to claim 1, further comprising:

a fourth operational amplifier including an inversion input terminal connected to a sixth node, a non-inversion input terminal, and an output terminal connected to the output terminal of the amplifying circuit;
a fifth input impedance element having one end connected to the second node and another end connected to the sixth node;
a sixth input impedance element having one end connected to the fourth node and another end connected to the sixth node;
a fifth feedback impedance element having one end connected to the sixth node and another end connected to the output terminal of the amplifying circuit; and
a sixth feedback impedance element having one end connected to the fifth node and another end connected to the output terminal of the amplifying circuit.

6. The amplifying circuit according to claim 4, wherein the third input impedance element is a third sample-and-hold circuit to sample the output voltage of the first operational amplifier, and
the fourth input impedance element is a fourth sample-and-hold circuit to sample the output voltage of the second operational amplifier.

7. The amplifying circuit according to claim 4, wherein the fourth feedback impedance element is a capacitative element.

8. The amplifying circuit according to claim 1, wherein the adder includes
a third sample-and-hold circuit to sample the output voltage of the first operational amplifier,
a first AD converter to execute AD conversion on a voltage held by the third sample-and-hold circuit,
a fourth sample-and-hold circuit to sample the output voltage of the second operational amplifier,
a second AD converter to execute AD conversion on a voltage held by the fourth sample-and-hold circuit, and
a digital adder to add output signals of the first AD converter and the second AD converter.

9. The amplifying circuit according to claim 1, wherein the adder includes
a buffer circuit to invert the output voltage of the first operational amplifier and outputs an output voltage, and
a fifth sample-and-hold circuit to sample the output voltage of the second operational amplifier and the output voltage of the buffer circuit.

10. The amplifying circuit according to claim 9, wherein the amplifying circuit has a differential configuration.

11. An AD converter comprising the amplifying circuit according to claim 1.

12. An integrated circuit comprising the AD converter according to claim 11.

13. A wireless communication apparatus comprising the integrated circuit according to claim 12.

* * * * *